US009593410B2

(12) United States Patent
Ge et al.

(10) Patent No.: US 9,593,410 B2
(45) Date of Patent: Mar. 14, 2017

(54) METHODS AND APPARATUS FOR STABLE SUBSTRATE PROCESSING WITH MULTIPLE RF POWER SUPPLIES

(71) Applicant: APPLIED MATERIALS, INC., Santa Clara, CA (US)

(72) Inventors: Zhenbin Ge, San Jose, CA (US); Alan A. Ritchie, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 238 days.

(21) Appl. No.: 13/785,880

(22) Filed: Mar. 5, 2013

(65) Prior Publication Data

US 2014/0251788 A1    Sep. 11, 2014

(51) Int. Cl.
| | |
|---|---|
| C23C 14/00 | (2006.01) |
| C25B 11/00 | (2006.01) |
| C25B 13/00 | (2006.01) |
| C23C 14/34 | (2006.01) |
| C23C 14/35 | (2006.01) |
| H01J 37/32 | (2006.01) |
| H01J 37/34 | (2006.01) |

(52) U.S. Cl.
CPC .......... *C23C 14/3471* (2013.01); *C23C 14/35* (2013.01); *H01J 37/32165* (2013.01); *H01J 37/32403* (2013.01); *H01J 37/3405* (2013.01); *H01J 37/3441* (2013.01); *H01J 37/3464* (2013.01)

(58) Field of Classification Search
CPC ...................... H01J 37/32155; H01J 37/32165
See application file for complete search history.

(56) References Cited

U.S. PATENT DOCUMENTS

| | | | | |
|---|---|---|---|---|
| 4,756,810 | A  * | 7/1988 | Lamont et al. | ............ 204/192.3 |
| 2005/0001555 | A1* | 1/2005 | Parsons et al. | .......... 315/111.21 |
| 2010/0276391 | A1* | 11/2010 | Grimbergen | .......... H01J 37/321 |
| | | | | 216/41 |

* cited by examiner

*Primary Examiner* — Ibrahime A Abraham
(74) *Attorney, Agent, or Firm* — Moser Taboada; Alan Taboada

(57) ABSTRACT

Methods and apparatus for processing substrates are provided herein. In some embodiments, a physical vapor deposition chamber includes a first RF power supply having a first base frequency and coupled to one of a target or a substrate support; and a second RF power supply having a second base frequency and coupled to one of the target or the substrate support, wherein the first and second base frequencies are integral multiples of each other, wherein the second base frequency is modified to an offset second base frequency that is not an integral multiple of the first base frequency.

18 Claims, 3 Drawing Sheets

METHODS AND APPARATUS FOR STABLE SUBSTRATE PROCESSING WITH MULTIPLE RF POWER SUPPLIES

FIELD

Embodiments of the present invention generally relate to plasma-enhanced substrate processing systems.

BACKGROUND

Substrate processing systems, such as physical vapor deposition (PVD) chambers, may use radio frequency (RF) signals to enhance substrate processing. For example, some systems may use multiple RF signals, such as a bias RF power, for example applied to an electrode disposed beneath a substrate, and a source RF power, for example applied to an electrode disposed in or near an upper region of the process chamber. The bias RF power may be used for example to control a DC bias formed on the substrate during processing and the source RF power may be used for example to form a plasma.

Typically, the frequencies of the bias RF power and the source RF power are determined by commercially available RF power equipment having specific available frequencies, and may be chosen according to the parameters of a specific processing application. For example, the substrate processing systems may be used for deposition and/or etching of materials in semiconductor device fabrication. The inventors have observed that in several instances, deposition and/or etching processes become unstable, for example when using bias RF power and source RF power under certain conditions.

Accordingly, the present invention provides methods and apparatus for stable substrate processing using multiple RF power supplies.

SUMMARY

Methods and apparatus for processing substrates are provided herein. In some embodiments, a physical vapor deposition chamber includes a first RF power supply having a first base frequency and coupled to one of a target or a substrate support; and a second RF power supply having a second base frequency and coupled to one of the target or the substrate support, wherein the first and second base frequencies are integral multiples of each other, wherein the second base frequency is modified to an offset second base frequency that is not an integral multiple of the first base frequency.

In some embodiments, a substrate processing system includes a target assembly; a substrate support disposed in a process chamber; a first RF power supply having a first base frequency and coupled to one of the target assembly or the substrate support; and a second RF power supply having a second base frequency and coupled to one of the target assembly or the substrate support, wherein the first and second base frequencies are integral multiples of each other, wherein the second base frequency is modified to an offset second base frequency that is not an integral multiple of the first base frequency.

In some embodiments, a method is provided for processing a substrate disposed on a substrate support in a physical vapor deposition (PVD) chamber having a target comprising a source material to be deposited on the substrate. In some embodiments, the method includes providing RF energy to one of the target or the substrate support from a first RF power supply having a first base frequency; simultaneously providing RF energy to one of the target or the substrate support from second RF power supply having a second base frequency, wherein the first and second base frequencies are integral multiples of each other, wherein the second base frequency is modified to an offset second base frequency that is not an integral multiple of the first base frequency; and processing a substrate using a plasma formed from the RF energy provided to the PVD chamber.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
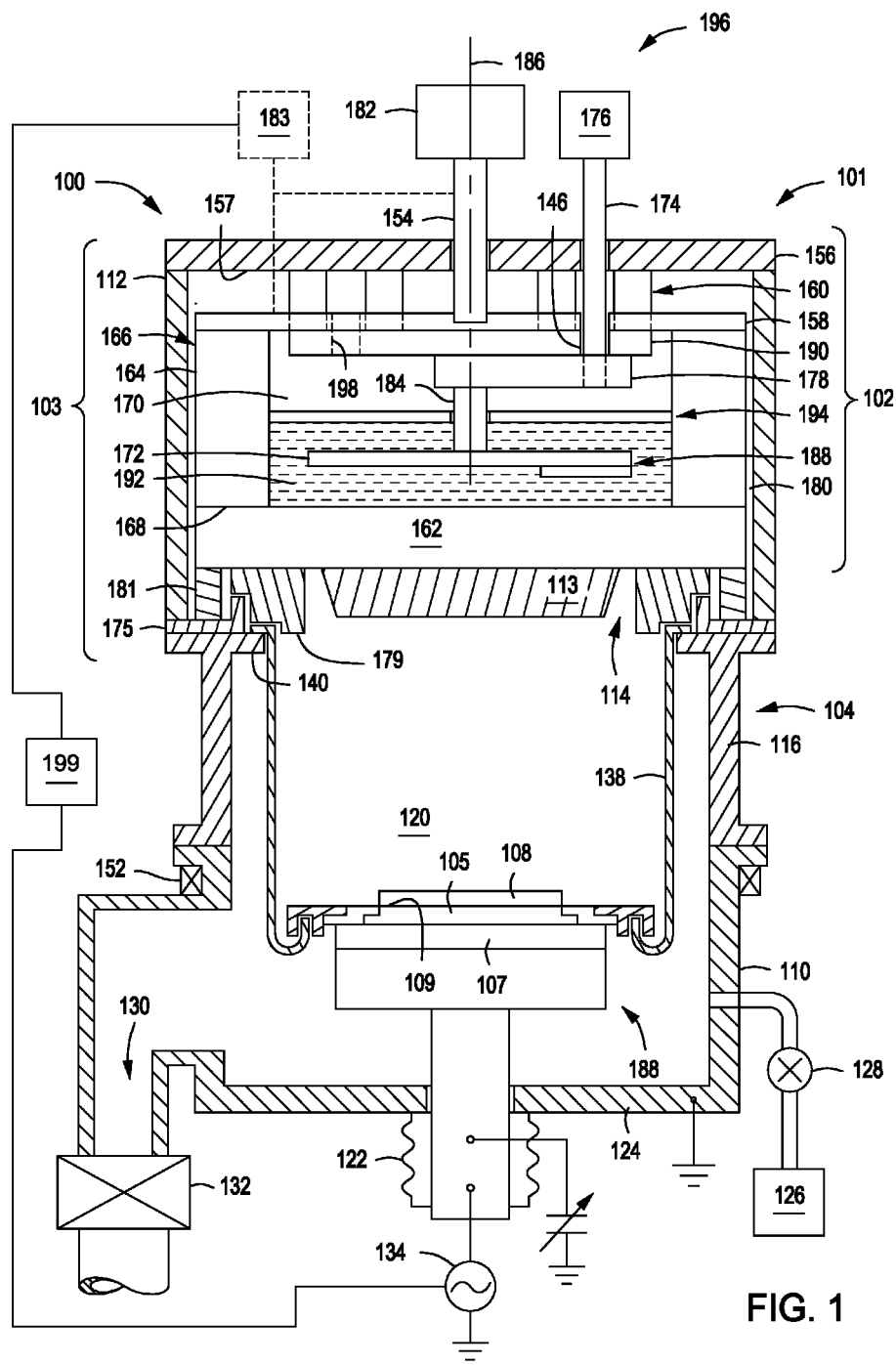
FIG. 1 depicts a schematic cross sectional view of a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of methods and apparatus for substrate processing comprising source RF power and bias RF power configured to provide modified frequency for use in plasma-enhanced substrate processing systems are provided herein. Frequency of at least one of the source RF power or the bias RF power may be configured such that the frequencies of the source RF power and the bias RF power are not integral multiples, and further the frequencies are offset from the integral multiple by at least 10 kHz, thereby advantageously limiting instability of a plasma formed during processing. Other and further embodiments of configured source RF power and bias RF power are discussed below. Reference may be made to the source RF power or the bias RF power as "first" or "second" RF power supply, unless otherwise stated, the terms "first" and "second" may be used to refer to either the source RF power or the bias RF power. That is, when first RF power supply refers to the source RF power, the second RF power supply shall mean the bias RF power, and when first RF power supply refers to the bias RF power, the second RF power supply shall mean the source RF power.

FIG. 1 depicts a simplified, cross-sectional view of a PVD chamber 100 in accordance with some embodiments of the present invention. Examples of PVD chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufacturers, including those configured for other types of processing besides PVD, may also benefit from modifications in accordance with the inventive apparatus disclosed herein.

In some embodiments of the present invention, the PVD chamber 100 includes a chamber lid 101 disposed atop a process chamber 104 and removable from the process chamber 104. The chamber lid 101 may include a target assembly 102 and a grounding assembly 103. The process chamber 104 contains a substrate support 106 for receiving a substrate 108 thereon. The substrate support 106 may be located within a lower grounded chamber wall 110, which may be a chamber wall of the process chamber 104. The lower grounded chamber wall 110 may be electrically coupled to the grounding assembly 103 of the chamber lid 101 such that an RF return path is provided to a source RF power supply 182 that provides RF energy to the target assembly 102 during processing. Alternatively or in combination, other RF return paths are possible, such as those that travel from the substrate support 106 and ultimately back to the grounding assembly 103 of the chamber lid 101.

The substrate support 106 has a material-receiving surface facing a principal surface of a target 114 and supports the substrate 108 to be sputter coated in planar position opposite to the principal surface of the target 114. The substrate support 106 may include a dielectric member 105 having a substrate processing surface 109 for supporting the substrate 108 thereon. In some embodiments, the substrate support 106 may include one or more conductive members 107 disposed below the dielectric member 105. For example, the dielectric member 105 and the one or more conductive members 107 may be part of an electrostatic chuck, an RF electrode, or the like which may be used to provide chucking or RF power to the substrate support 106.

The substrate support 106 may support the substrate 108 in a first volume 120 of the process chamber 104. The first volume 120 may be a portion of the inner volume of the process chamber 104 that is used for processing the substrate 108 and may be separated from the remainder of the inner volume (e.g., a non-processing volume) during processing of the substrate 108, for example, by a grounded inner shield 138. The first volume 120 is defined as the region above the substrate support 106 during processing (for example, between the target 114 and the substrate support 106 when in a processing position).

In some embodiments, the substrate support 106 may be vertically movable to allow the substrate 108 to be transferred onto the substrate support 106 through a slit valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a desired pressure inside the process chamber 104.

A bias RF power supply 134 is coupled to the substrate support 106 in order to induce a negative DC bias on the substrate 108. For example, the bias RF power supply 134 may provide RF energy having a base frequency of about 2 MHz to about 60 MHz, for example, non-limiting base frequencies such as 2 MHz, 13.56 MHz, or 60 MHz. As used herein, the term "base frequency" refers to the nominal frequency at which an RF power supply provides RF energy. In some embodiments, the base frequency can be fixed. In some embodiments the base frequency may be modifiable, or adjustable to an offset base frequency. In some embodiments, the RF power supply (either or both of the bias RF power supply or the source RF power supply) can provide a variable frequency as part of a frequency tuning system to minimize reflected RF power returning to the RF power supply during use. Such frequency tuning is typically centered about the base frequency and is not considered a modification of the base frequency in terms of the present invention. The offset base frequency can still vary plus or minus some amount to provide frequency tuning about the offset base frequency. In some embodiments, the bias RF power supply 134 is a commercially available power supply having a base frequency of 2 MHz, 13.56 MHz, or 60 MHz. In some embodiments, the bias RF power supply 134 has a modifiable base frequency. The frequency of the bias RF power supply 134 may also be modified using control mechanisms including software/firmware modules.

In some embodiments, a magnet 152 may be disposed about the process chamber 104 for selectively providing a magnetic field between the substrate support 106 and the target 114. For example, as shown in FIG. 1, the magnet 152 may be disposed about the outside of the chamber wall 110 in a region just above the substrate support 106 when in processing position. As illustrated in FIG. 1, the chamber lid 101 may rest on a ledge 140 of an upper grounded enclosure wall 116. In some embodiments, the magnet 152 may be disposed additionally or alternatively in other locations, such as adjacent the upper grounded enclosure wall 116. The magnet 152 may be an electromagnet and may be coupled to a power supply (not shown) for controlling the magnitude of the magnetic field generated by the electromagnet.

The chamber lid 101 generally includes the grounding assembly 103 disposed about the target assembly 102. The grounding assembly 103 may illustratively include a grounding plate 156 having a first surface 157 that may be generally parallel to and opposite a backside of the target assembly 102. A grounding shield 112 may extend from the first surface 157 of the grounding plate 156 and surround the target assembly 102. The grounding assembly 103 may include a support member 175 to support the target assembly 102 within the grounding assembly 103. Other grounding assemblies may alternatively be used.

In some embodiments, the support member 175 may be coupled to a lower end of the grounding shield 112 proximate an outer peripheral edge of the support member 175 and extends radially inward to support a seal ring 181, the target assembly 102 and optionally, a dark space shield 179. The seal ring 181 may be a ring or other annular shape having a desired cross-section. The seal ring 181 may include two opposing planar and generally parallel surfaces to facilitate interfacing with the target assembly 102, such as the backing plate 162, on a first side of the seal ring 181 and with the support member 175 on a second side of the seal ring 181. The seal ring 181 may be made of a dielectric material, such as ceramic. The seal ring 181 may insulate the target assembly 102 from the ground assembly 103.

The dark space shield 179 is generally disposed about an outer edge of the target 114, such about an outer edge of a source material 113 of the target 114. In some embodiments, the seal ring 181 is disposed adjacent to an outer edge of the dark space shield 179 (i.e., radially outward of the dark space shield 179). In some embodiments, the dark space shield 179 is made of a dielectric material, such as ceramic. By providing a dielectric dark space shield 179, arcing between the dark space shield and adjacent components that are RF hot may be avoided or minimized. Alternatively, in some embodiments, the dark space shield 179 is made of a conductive material, such as stainless steel, aluminum, or the like. By providing a conductive dark space shield 179 a more uniform electric field may be maintained within the PVD chamber 100, thereby promoting more uniform processing of substrates therein. In some embodiments, a lower portion of the dark space shield 179 may be made of a conductive material and an upper portion of the dark space shield 179 may be made of a dielectric material.

The support member 175 may be a generally planar member having a central opening to accommodate the dark space shield 179 and the target 114. In some embodiments, the support member 175 may be circular, or disc-like in shape, although the shape may vary depending upon the corresponding shape of the chamber lid and/or the shape of the substrate to be processed in the PVD chamber 100. In use, when the chamber lid 101 is opened or closed, the support member 175 maintains the dark space shield 179 in proper alignment with respect to the target 114, thereby minimizing the risk of misalignment due to chamber assembly or opening and closing the chamber lid 101.

The target assembly 102 may include a source distribution plate 158 opposing a backside of the target 114 and electrically coupled to the target 114 along a peripheral edge of the target 114. The target 114 may comprise a source material 113 to be deposited on a substrate, such as the substrate 108 during sputtering, such as a metal, metal oxide, metal alloy, or the like. In some embodiments, the target 114 may include a backing plate 162 to support the source material 113. The source material 113 may be disposed on a substrate support facing side of the backing plate 162, as illustrated in FIG. 1. The backing plate 162 may comprise a conductive material, such as copper-zinc, copper-chrome, or the same material as the target, such that RF and DC power can be coupled to the source material 113 via the backing plate 162. Alternatively, the backing plate 162 may be non-conductive and may include conductive elements (not shown) such as electrical feedthroughs or the like.

A conductive member 164 may be disposed between the source distribution plate and the backside of the target 114 to propagate RF energy from the source distribution plate to the peripheral edge of the target 114. The conductive member 164 may be cylindrical, with a first end 166 coupled to a target-facing surface of the source distribution plate 158 proximate the peripheral edge of the source distribution plate 158 and a second end 168 coupled to a source distribution plate-facing surface of the target 114 proximate the peripheral edge of the target 114. In some embodiments, the second end 168 is coupled to a source distribution plate facing surface of the backing plate 162 proximate the peripheral edge of the backing plate 162.

The target assembly 102 may include a cavity 170 disposed between the backside of the target 114 and the source distribution plate 158. The cavity 170 may at least partially house a magnetron assembly 196 as discussed below. The cavity 170 is at least partially defined by the inner surface of the conductive member 164, a target facing surface of the source distribution plate 158, and a source distribution plate facing surface (e.g., backside) of the target 114 (or backing plate 162). In some embodiments, the cavity 170 may be at least partially filled with a cooling fluid 192, such as water ($H_2O$) or the like. In some embodiments, a divider 194 may be provided to contain the cooling fluid 192 in a desired portion of the cavity 170 (such as a lower portion, as shown) and to prevent the cooling fluid 192 from reaching components disposed on the other side of the divider 194, as discussed below.

An insulative gap 180 is provided between the grounding plate 156 and the outer surfaces of the source distribution plate 158, the conductive member 164, and the target 114 (and/or backing plate 162). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 should be between 5 mm and 40 mm.

The grounding assembly 103 and the target assembly 102 may be electrically separated by the seal ring 181 and by one or more of insulators 160 disposed between the first surface 157 of the grounding plate 156 and the backside of the target assembly 102, e.g., a non-target facing side of the source distribution plate 158.

In some embodiments, the source RF power supply 182 is connected to the target assembly 102 via an electrode 154 (e.g., a RF feed structure). Alternatively, other RF propagation paths may be used to provide RF energy to the source materials of the target assembly 102. The source RF power supply 182 may include an RF generator and a matching circuit, for example, to minimize reflected RF energy reflected back to the RF generator during operation. For example, RF energy supplied by the source RF power supply 182 may have a base frequency of about 13.56 MHz and to about 162 MHz or above. For example, non-limiting base frequencies such as those commercially available, for example, 13.56 MHz, 27.12 MHz, 60 MHz, or 162 MHz can be used. In some embodiments, the source RF power supply 182 is a commercially available power supply having a base frequency of 13.56 MHz, 27.12 MHz, 60 MHz, or 162 MHz. In some embodiments, the source RF power supply 182 has a modifiable base frequency that provides an offset base frequency. Control mechanisms including software/firmware modules are also usable to modify the frequency of the source RF power supply 182 to provide the offset base frequency.

The inventors have observed that for several processes using two RF power supplies at frequencies that are integral multiples, for example, certain deposition and/or etching processes, the plasma may become unstable, undesirably leading to process non-uniformities. The inventors believe that the problem is due to the commercially available RF power supplies having frequencies that are exact integral multiples, or harmonics, of each other. It is believed that such an arrangement causes interference that leads to instability of the plasma process, which further degrades quality and performance of the deposition and/or etching process. Thus, inventors have devised a solution to reduce and/or eliminate this instability by modifying the base frequency of the bias RF power supply 134, or the source RF power supply 182, or both, such that the frequencies of the bias RF power supply 134 and the source RF power supply 182 are not exact harmonics of each other.

As such, in some embodiments, the bias RF power supply 134 and the source RF power supply 182 are selected from commercially available RF power supplies, that typically have base frequencies of 13.56 MHz, 27.12 MHz, 60 MHz, or 162 MHz for source RF power and base frequencies of 2 MHz, 13.56 MHz, or 60 MHz for bias RF power. For example, some deposition and etching processes require bias RF power supply 134 at 700 W and a base frequency of 13.56 MHz, and the source RF power supply 182 at 500 W and a base frequency of 40.68 MHz.

In some embodiments, an offset of at least about 10 kHz is made to the base frequency of at least one of the bias RF power supply 134 and the source RF power supply 182. In some such embodiments, the modification of the frequencies is such that a first base frequency of a first RF power supply is modified to be a first offset base frequency that is not an exact harmonic of a second base frequency of a second RF power supply. The amount of the offset may be about 0.05% to about 5% of the lower of the first base frequency and the second base frequency. For example, if the first base frequency is denoted by "f1", the second base frequency is denoted by "f2", then:

$$f2 = X*f1 +/- Y*f1 \qquad \text{Equation (1)}$$

where X is an integer between 1 and 5, and where Y is a number between 0.0005 and 0.05. In some embodiments, the first RF power supply is the bias RF power supply 134 and the second RF power supply is the source RF power supply 182, while in other embodiments, the converse is true.

In some embodiments, the frequency is modified by modifying the base frequency of the bias RF power supply 134 and/or the source RF power supply 182 such that the frequency of one power supply is not an integral multiple, or exact harmonic, of the other, for example as described above. Alternatively or in combination, a frequency control module 199 is coupled to at least one of the bias RF power supply 134 and the source RF power supply 182. The frequency control module 199 is a microprocessor or a microcontroller enabled processing device configured to execute programmable code. The frequency control module 199, in combination with software, is configured to modify the base frequency of the RF power supplies, for example, the bias RF power supply 134 and the source RF power supply 182. In some embodiments, the frequency control module 199 includes a firmware for operating the RF power supplies, and the firmware may be upgradable to include software with instructions to modify the frequency of the RF power supplies.

Figure 2A:
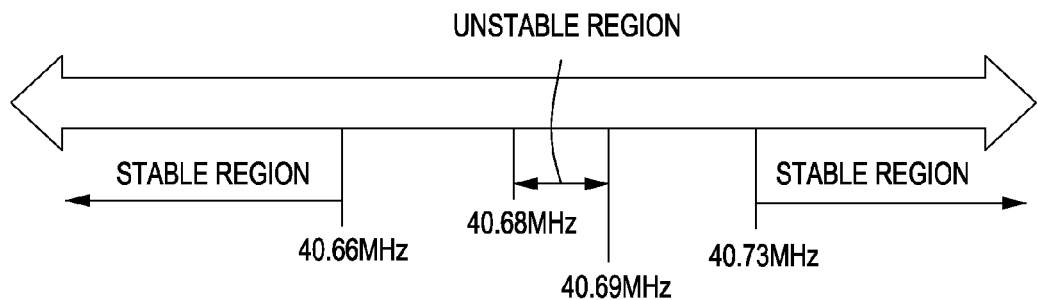
FIGS. 2A-C depict graphs illustrating stabilization of source power and bias power during a substrate process in accordance with some embodiments of the present invention.
Figure 2B:
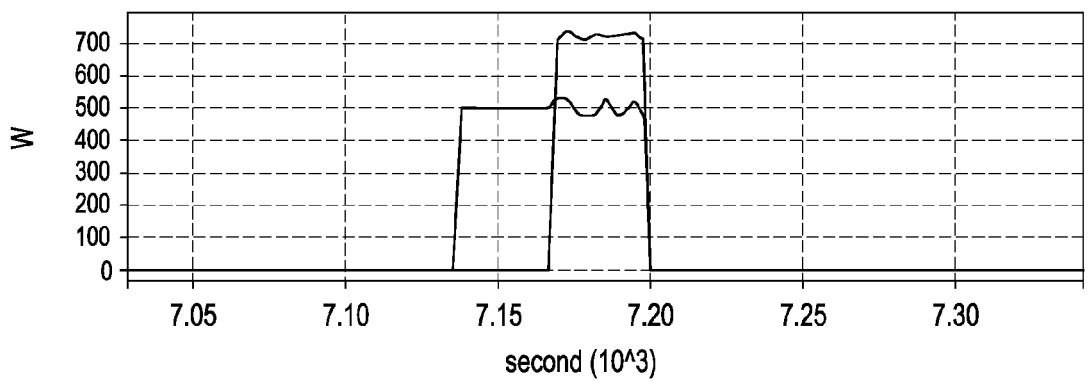
Figure 2C:
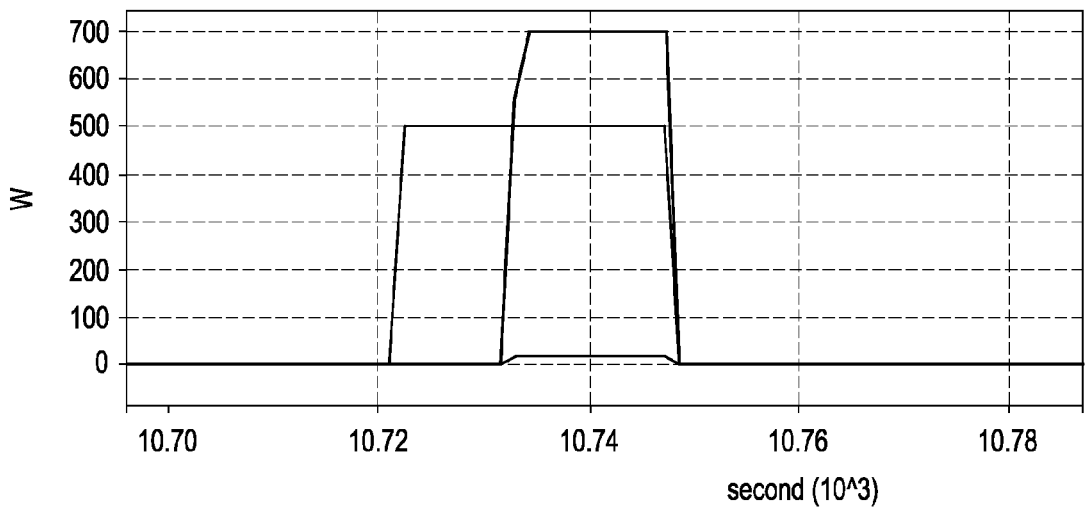

In some embodiments, a PVD chamber includes the bias RF power supply 134, which has a base frequency of 13.56 MHz operating at, for example, 700 W, and the source RF power supply 182, which has a base frequency of 40.68 MHz operating, for example, at 500 W. Operating the bias RF power at 13.68 MHz and the source RF power supply 182 at 40.68 MHz results in instability in both the bias RF power supply 134 and the source RF power supply 182, as illustrated by FIGS. 2A and 2B. In some embodiments, the frequency control module 199 modifies the base frequency of the source RF power supply 182 to be offset from 40.68 MHz to an offset base frequency of about 40.66 MHz, or lower, or to an offset base frequency of about 40.73 MHz, or higher, to achieve stability for the bias RF power supply 134 and the source RF power supply 182, for example as illustrated in FIG. 2C. Similarly, according to some embodiments, the frequency control module 199 modifies the base frequency of the bias RF power supply 134 to be offset from 13.56 MHz to an offset base frequency of about 13.55 MHz or lower, or to about 13.57 MHz or higher, to achieve stability in the bias RF power supply 134 and the source RF power supply 182, for example, similar to the embodiment illustrated by FIG. 2C.

In some embodiments, the frequency control module 199 modifies the base frequency of both the bias RF power supply 134 and the source RF power supply 182 to be offset base frequencies that are not integral multiples, or harmonics, of each other. For example, the base frequency of the bias RF power supply 134 may be modified to an offset base frequency of about 13.55 MHz and the base frequency of the source RF power supply 182 may be modified to an offset base frequency of about 40.69 MHz. According to another example, the base frequency of the bias RF power supply 134 may be modified to an offset base frequency of about 13.57 MHz and the base frequency of the source RF power supply 182 may be modified to an offset base frequency of about 40.67 MHz. In general, the base frequencies provided by the source and bias RF power supplies 182, 134 may be offset such that they are not integral multiples of each other in accordance with Equation (1) discussed above. Such offset of the base frequencies of the source RF power supply 182 and the bias RF power supply 134 advantageously achieves stability in the bias RF power supply 134 and the source RF power supply 182, for example, similar to the embodiment illustrated by FIG. 2C.

Figure 3:
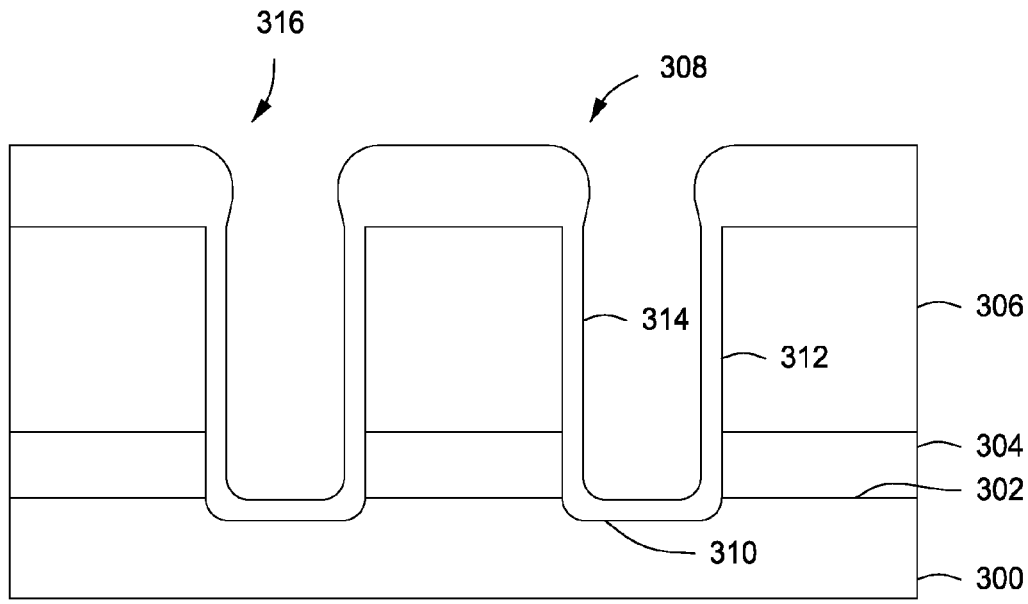
FIG. 3 depicts an internal structure of a processed substrate in accordance with some embodiments of the present invention.

In some embodiments, the modification of the base frequency of the bias RF power supply 134 and/or the source RF power supply 182 is made by direct modification of the base frequency of the bias RF power supply 134 and/or the base frequency of the source RF power supply 182 without using the frequency control module 199. In some embodiments, the base frequency of any one or both the RF power supplies is modified, for example, using an internal frequency adjustment function of the RF power supply. Various embodiments discussed herein provide a stable and low reflected power on bias RF power and source RF power, and provide improved process results. For example, and as illustrated in FIG. 3, the inventors have observed a deposition process to deposit a material 314 on a sidewall 312 and bottom 310 of a feature 308 resulting in improved sidewall coverage and minimal overhang (as indicated by 316), for example as illustrated by FIG. 3, in which the process yielded a deposition of material 314 having a sidewall 312 to bottom 310 coverage ratio of about 40%.

While specific embodiments have been illustrated with respect to the examples illustrated by various figures, with the bias RF power supply 134 having a frequency 13.56 MHz, and the source RF power supply 182 having a frequency 40.68 MHz, various embodiments are not limited to such examples, and are applicable to other frequency ranges and various power levels according to the application process.

Figure 4:
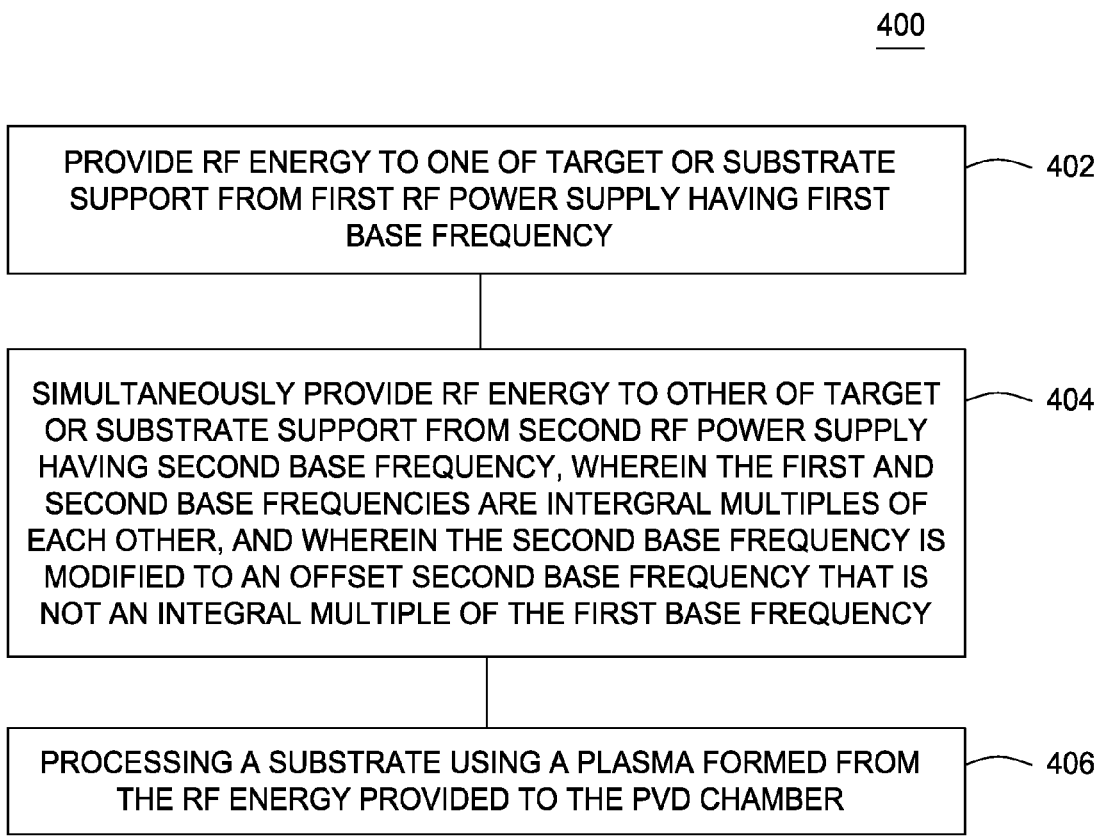
FIG. 4 depicts a method of processing a substrate disposed on a substrate support in a physical vapor deposition (PVD) chamber in accordance with some embodiments of the present invention.

For example, FIG. 4 depicts a method 400 of processing a substrate disposed on a substrate support in a physical vapor deposition (PVD) chamber in accordance with some embodiments of the invention. The PVD chamber can be any suitable PVD chamber such as the PVD chamber 100 described above or other PVD chambers suitably modified to perform methods in accordance with the teachings provided herein.

The substrate may comprise any suitable material used in the fabrication of semiconductor devices. For example, in some embodiments, the substrate may comprise a semiconducting material and/or combinations of semiconducting materials and non-semiconductive materials for forming semiconductor structures and/or devices. For example, the substrate may comprise one or more silicon-containing materials such as crystalline silicon (e.g., Si<100> or Si<111>), strained silicon, polysilicon, germanium, silicon germanium, or the like. The substrate may further have any desired geometry, such as a 200 or 300 mm wafer, square or rectangular panels, or the like. In some embodiments, the substrate may be a semiconductor wafer (e.g., a 200 mm, 300 mm, or the like silicon wafer).

The substrate can include one or more additional layers disposed on a surface of the substrate and may also include one or more features, such as a trench, a via, a dual damascene structure, a film stack, or the like. For example, as depicted in FIG. 3, a substrate 300 may have a first layer 304 disposed atop a surface 302 of the substrate 300 and a second layer 306 disposed atop the first layer 304. The first layer 304 and second layer 306 may comprise any materials suitable for semiconductor device fabrication. For example, in some embodiments, the first layer 304 and second layer 306 may be oxide layers, nitride layers, high or low K dielectric layers, conductive layers, or the like. The first layer 304 and second layer 306 may be formed via any suitable process, for example, such as physical vapor deposition, chemical vapor deposition, epitaxial growth, or the like. In some embodiments, a feature 308 having a sidewall 312 and bottom 310 may be formed in the substrate 300, including any layers disposed on the substrate, for example, through the first layer 304 and second layer 306 and at least a portion of the substrate 300. The feature 308 may be any type of feature, for example a trench, via, or the like. In some embodiments, the feature 308 may be a high aspect ratio feature (e.g., having a height to width ratio of greater than about 4:1).

The method 400 generally begins at 402 where RF energy is provided to one of the target or the substrate support from a first RF power supply having a first base frequency. Next, and 404, RF energy is simultaneously provided to the other of the target or the substrate support from a second RF power supply having a second base frequency. The first and second base frequencies are integral multiples of each other and the second base frequency is modified to an offset second base frequency that is not an integral multiple of the first base frequency. For example, the first and second RF power supplies can be the RF power supplied discussed above. The offset second base frequency can be provided in any of the ways described above. Next, at 406 a substrate is processed using a plasma formed from the RF energy provided to the PVD chamber.

Any process using a plasma that is suitable for semiconductor device fabrication may be performed on the substrate. For example, in some embodiments, a material 314 may be deposited atop the substrate 300 and on the sidewall 312 and bottom 310 of the feature 308, such as shown in FIG. 3. In such embodiments, the material 314 may be deposited such that a sidewall 312 to bottom 310 coverage ratio of greater than about 38%, or in some embodiments, about 40%, is obtained.

Returning to FIG. 1, in some embodiments, an auxiliary energy source 183 may be coupled to the target assembly 102 to provide additional energy to the target 114 during processing. In some embodiments, the auxiliary energy source 183 may be a DC power supply to provide DC energy, for example, to enhance a sputtering rate of the target material (and hence, a deposition rate on the substrate). In some embodiments, the auxiliary energy source 183 may be an RF power supply, similar to the source RF power supply 182, to provide RF energy, for example, at an auxiliary frequency different than the frequency provided by the source RF power supply 182. In embodiments where the auxiliary energy source 183 is a DC power supply, the auxiliary energy source may be coupled to the target assembly 102 in any location suitable to electrically couple the DC energy to the target 114, such as the electrode 154 or some other conductive member (such as the source distribution plate 158, discussed below). In embodiments where the auxiliary energy source 183 is a RF power supply, the auxiliary energy source 183 may be coupled to the target assembly 102 via the electrode 154.

The electrode 154 may be cylindrical or otherwise rod-like and may be aligned with a central axis 186 of the PVD chamber 100 (e.g., the electrode 154 may be coupled to the target assembly at a point coincident with a central axis of the target, which is coincident with the central axis 186). The electrode 154, aligned with the central axis 186 of the PVD chamber 100, facilitates applying RF energy from the source RF power supply 182 to the target 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter, however, the smaller the diameter of the electrode 154, the closer the RF energy application approaches a true single point. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like.

The electrode 154 may pass through the grounding plate 156 and is coupled to a source distribution plate 158. The grounding plate 156 may comprise any suitable conductive material, such as aluminum, copper, or the like. The open spaces between the one or more insulators 160 allow for RF wave propagation along the surface of the source distribution plate 158. In some embodiments, the one or more insulators 160 may be symmetrically positioned with respect to the central axis 186 of the PVD chamber 100 Such positioning may facilitate symmetric RF wave propagation along the surface of the source distribution plate 158 and, ultimately, to a target 114 coupled to the source distribution plate 158. The RF energy may be provided in a more symmetric and uniform manner as compared to conventional PVD chambers due, at least in part, to the central position of the electrode 154.

One or more portions of a magnetron assembly 196 may be disposed at least partially within the cavity 170. The magnetron assembly provides a rotating magnetic field proximate the target to assist in plasma processing within the process chamber 104. In some embodiments, the magnetron assembly 196 may include a motor 176, a motor shaft 174, a gearbox 178, a gearbox shaft 184, and a rotatable magnet (e.g., a plurality of magnets 188 coupled to a magnet support member 172).

In some embodiments, the magnetron assembly 196 is rotated within the cavity 170. For example, in some embodiments, the motor 176, motor shaft 174, gear box 178, and gearbox shaft 184 may be provided to rotate the magnet support member 172. In conventional PVD chambers having magnetrons, the magnetron drive shaft is typically disposed along the central axis of the chamber, preventing the coupling of RF energy in a position aligned with the central axis of the chamber. To the contrary, in embodiments of the present invention, the electrode 154 is aligned with the central axis 186 of the PVD chamber. As such, in some embodiments, the motor shaft 174 of the magnetron may be disposed through an off-center opening in the grounding plate 156. The end of the motor shaft 174 protruding from the grounding plate 156 is coupled to a motor 176. The motor shaft 174 is further disposed through a corresponding off-center opening through the source distribution plate 158 (e.g., a first opening 146) and coupled to a gear box 178. In some embodiments, one or more second openings 198 may be disposed though the source distribution plate 158 in a symmetrical relationship to the first opening 146 to advantageously maintain axisymmetric RF distribution along the source distribution plate 158. The one or more second openings 198 may also be used to allow access to the cavity 170 for items such as optical sensors or the like.

The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer 190 between the gear box 178 and the source distribution plate 158, or the like. The gear box 178 is further coupled to the magnet support member 172 via the gear box shaft 184 to transfer the rotational motion provided by the motor 176 to the magnet support member 172 (and hence, the plurality of magnets 188).

The magnet support member 172 may be constructed from any material suitable to provide adequate mechanical strength to rigidly support the plurality of magnets 188. For example, in some embodiments, the magnet support member 172 may be constructed from a non-magnetic metal, such as non-magnetic stainless steel. The magnet support member 172 may have any shape suitable to allow the plurality of magnets 188 to be coupled thereto in a desired position. For example, in some embodiments, the magnet support member 172 may comprise a plate, a disk, a cross member, or the like. The plurality of magnets 188 may be configured in any manner to provide a magnetic field having a desired shape and strength.

Alternatively, the magnet support member 172 may be rotated by any other means with sufficient torque to overcome the drag caused on the magnet support member 172 and attached plurality of magnets 188, for example due to the cooling fluid 192, when present, in the cavity 170. For example, in some embodiments, (not shown), the magnetron assembly 196 may be rotated within the cavity 170 using a motor 176 and motor shaft 174 disposed within the cavity 170 and directly connected to the magnet support member 172 (for example, a pancake motor). The motor 176 must be sized sufficiently to fit within the cavity 170, or within the upper portion of the cavity 170 when the divider 194 is present. The motor 176 may be an electric motor, a pneumatic or hydraulic drive, or any other process-compatible mechanism that can provide the required torque.

While the foregoing is directed to embodiments of the present invention, other and further embodiments of the invention may be devised without departing from the basic scope thereof.

The invention claimed is:

1. A physical vapor deposition (PVD) chamber, comprising:

a first RF power supply having a first base frequency and coupled to one of a target or a substrate support; and a second RF power supply having a second base frequency and coupled to one of the target or the substrate support, wherein the first and second base frequencies are integral multiples of each other, wherein either the second RF power supply is a fixed frequency RF power supply, or the second RF power supply is a variable frequency RF power supply that provides a variable frequency as a part of a frequency tuning system which minimizes reflected RF power returning to the second RF power supply, and wherein the second RF power supply comprises an internal frequency adjuster that modifies the second RF power supply to provide an offset second base frequency that is not an integral multiple of the first base frequency, wherein the offset second base frequency is defined by $X^*(f1)+/-Y^*(f1)$, wherein (f1) is the first base frequency, X is an integer between 1 and 5, and Y is a real number between 0.0005 and 0.05.

2. The PVD chamber of claim 1, wherein the second base frequency is offset from the integral multiple of the first base frequency by at least 10 kHz.

3. The PVD chamber of claim 1, wherein the second base frequency is modified to the offset second base frequency within the second RF power supply.

4. The PVD chamber of claim 1, wherein the first base frequency is either 13.56 MHz or 40.68 MHZ, wherein, if the first base frequency is 13.56 MHz, the offset second base frequency is equal to or greater than 40.73 MHz or is equal to or lesser than 40.66 MHz, and wherein, if the first base frequency is 40.68 MHz, the offset second base frequency is equal to or greater than 13.57 MHz or is equal to or lesser than 13.55 MHz.

5. The PVD chamber of claim 1, wherein the second RF power supply provides RF energy at a tunable frequency centered about the second base frequency.

6. The PVD chamber of claim 1, wherein the second RF power supply provides RF energy at a tunable frequency centered about the offset second base frequency.

7. A physical vapor deposition (PVD) chamber, comprising:

a first RF power supply having a first base frequency and coupled to one of a target or a substrate support;

a second RF power supply having a second base frequency and coupled to one of the target or the substrate support, wherein the first and second base frequencies are integral multiples of each other, and wherein either the second RF power supply is a fixed frequency RF power supply, or the second RF power supply is a variable frequency RF power supply that provides a variable frequency as a part of a frequency tuning system which minimizes reflected RF power returning to the second RF power supply; and a frequency control module coupled to the second RF power supply and configured to modify the second base frequency of the second RF power supply to an offset second base frequency that is not an integral multiple of the first base frequency and that is defined by $X^*(f1)+/-Y^*(f1)$, wherein (f1) is the first base frequency, X is an integer between 1 and 5, and Y is a real number between 0.0005 and 0.05.

8. The PVD chamber of claim 7, wherein the frequency control module is further coupled to the first RF power supply to modify the first base frequency to an offset first base frequency.

9. The PVD chamber of claim 7, wherein the second RF power supply provides RF energy at a tunable frequency centered about the second base frequency.

10. The PVD chamber of claim 7, wherein the second RF power supply provides RF energy at a tunable frequency centered about the offset second base frequency.

11. A substrate processing system, comprising:
a target assembly;
a substrate support disposed in a process chamber;
a first RF power supply having a first base frequency and coupled to one of the target assembly or the substrate support; and
a second RF power supply having a second base frequency and coupled to one of the target assembly or the substrate support, wherein the first and second base frequencies are integral multiples of each other, wherein either the second RF power supply is a fixed frequency RF power supply, or the second RF power supply is a variable frequency RF power supply that provides a variable frequency as a part of a frequency tuning system which minimizes reflected RF power returning to the second RF power supply, and wherein either the second RF power supply comprises an internal frequency adjuster that modifies the second RF power supply to provide an offset second base frequency that is not an integral multiple of the first base frequency, wherein the offset second base frequency is defined by X*(f1)+/−Y*(f1), wherein (f1) is the first base frequency, X is an integer between 1 and 5, and Y is a real number between 0.0005 and 0.05,
or the substrate processing system further comprises a frequency control module coupled to the second RF power supply to modify the second base frequency of the second RF power supply an offset second base frequency that is not an integral multiple of the first base frequency and that is defined by X*(f1)+/−Y*(f1), wherein (f1) is the first base frequency, X is an integer between 1 and 5, and Y is a real number between 0.0005 and 0.05.

12. The substrate processing system of claim 11, wherein the second base frequency is offset from the integral multiple of the first base frequency by at least 10 kHz.

13. The substrate processing system of claim 11, further comprising a frequency control module coupled to the second RF power supply to modify the second base frequency of the second RF power supply.

14. The substrate processing system of claim 13, wherein the frequency control module is further coupled to the first RF power supply to modify the first base frequency to an offset first base frequency.

15. The substrate processing system of claim 1, wherein the second base frequency is modified to the offset second base frequency within the second RF power supply.

16. The substrate processing system of claim 11, wherein the first base frequency is either 13.56 MHz or 40.68 MHZ, wherein, if the first base frequency is 13.56 MHz, the offset second base frequency is equal to or greater than 40.73 MHz or is equal to or lesser than 40.66 MHz, and wherein, if the first base frequency is 40.68 MHz, the offset second base frequency is equal to or greater than 13.57 MHz or is equal to or lesser than 13.55 MHz.

17. The substrate processing system of claim 11, wherein the second RF power supply provides RF energy at a tunable frequency centered about the second base frequency.

18. The substrate processing system of claim 11, wherein the second RF power supply provides RF energy at a tunable frequency centered about the offset second base frequency.

* * * * *